(12) United States Patent
Chuang et al.

(10) Patent No.: US 10,913,653 B2
(45) Date of Patent: Feb. 9, 2021

(54) METHOD OF FABRICATING MEMS DEVICES USING PLASMA ETCHING AND DEVICE THEREFOR

(71) Applicant: MCube Inc., San Jose, CA (US)

(72) Inventors: Ben (Wen-Pin) Chuang, Hsinchu (TW); M H (Ming-Hong) Kuo, Hsinchu (TW); W J (Wen-Chih) Chen, Hsinchu (TW); Tse-Hsi "Terrence" Lee, San Jose, CA (US)

(73) Assignee: MCUBE INC., San Jose, CA (US)

( * ) Notice: Subject to any disclaimer, the term of this patent is extended or adjusted under 35 U.S.C. 154(b) by 0 days.

(21) Appl. No.: 14/658,114

(22) Filed: Mar. 13, 2015

(65) Prior Publication Data

US 2016/0257559 A1    Sep. 8, 2016

Related U.S. Application Data

(60) Provisional application No. 61/953,699, filed on Mar. 14, 2014.

(51) Int. Cl.
*B81B 7/00* (2006.01)
*B81C 1/00* (2006.01)

(52) U.S. Cl.
CPC ........ *B81B 7/0006* (2013.01); *B81C 1/00531* (2013.01); *B81B 2201/0235* (2013.01);
(Continued)

(58) Field of Classification Search
CPC .......... B81B 7/0006; B81B 2201/0235; B81B 2201/0242; B81B 2203/0307; B81C 1/00531
(Continued)

(56) References Cited

U.S. PATENT DOCUMENTS 3,614,677 A   10/1971  Wilfinger
5,121,633 A *  6/1992  Murakami ............ G01P 15/123
                                                          338/46
(Continued)

FOREIGN PATENT DOCUMENTS

WO    WO2010092399 A2    8/2010

OTHER PUBLICATIONS

Restriction Requirement received in U.S. Appl. No. 14/507,177, dated Dec. 24, 2015. 7 pages.
(Continued)

*Primary Examiner* — Ori Nadav
(74) *Attorney, Agent, or Firm* — Richard T. Ogawa; Ogawa P.C.

(57) ABSTRACT

A method for fabricating a MEMS sensor device. The method can include providing a substrate, forming an IC layer overlying the substrate, forming an oxide layer overlying the IC layer, forming a metal layer coupled to the IC layer through the oxide layer, forming a MEMS layer having a pair of designated sense electrode portions and a designated proof mass portion overlying the oxide layer, forming a via structure within each of the designated sense electrode portions, and etching the MEMS layer to form a pair of sense electrodes and a proof mass from the designated sense electrode portions and proof mass portions, respectively. The via structure can include a ground post and the proof mass can include a sense comb. The MEMS sensor device formed using this method can result is more well-defined edges of the proof mass structure.

20 Claims, 5 Drawing Sheets

(52) U.S. Cl.
CPC ............... *B81B 2201/0242* (2013.01); *B81B 2203/0307* (2013.01); *B81B 2203/04* (2013.01); *B81C 2203/0109* (2013.01)

(58) Field of Classification Search
USPC ................................. 257/415, 417, 418, 420
See application file for complete search history.

(56) References Cited

U.S. PATENT DOCUMENTS

| | | | |
|---|---|---|---|
| 5,594,172 A * | 1/1997 | Shinohara | G01P 15/0802 73/514.33 |
| 5,736,732 A | 4/1998 | Possin et al. | |
| 5,825,385 A | 10/1998 | Silverbrook | |
| 6,078,016 A * | 6/2000 | Yoshikawa | G01P 15/0802 200/181 |
| 6,548,321 B1 * | 4/2003 | Sawyer | B81C 1/0092 438/50 |
| 6,736,008 B2 * | 5/2004 | Kumagai | G01P 15/125 73/504.02 |
| 6,978,673 B2 * | 12/2005 | Johnson | G01R 33/0286 438/50 |
| 7,202,552 B2 * | 4/2007 | Zhe | B81C 1/0023 257/659 |
| 7,595,209 B1 | 9/2009 | Monadgemi et al. | |
| 8,113,054 B2 * | 2/2012 | Je | G01P 15/0802 73/514.32 |
| 8,164,171 B2 | 4/2012 | Lin et al. | |
| 8,181,874 B1 | 5/2012 | Wan et al. | |
| 8,205,498 B2 | 6/2012 | Hsu et al. | |
| 8,227,285 B1 | 7/2012 | Yang | |
| 8,236,577 B1 | 8/2012 | Hsu et al. | |
| 8,245,923 B1 | 8/2012 | Merrill et al. | |
| 8,324,047 B1 | 12/2012 | Yang | |
| 8,367,522 B1 | 2/2013 | Yang | |
| 8,395,252 B1 | 3/2013 | Yang | |
| 8,402,666 B1 | 3/2013 | Hsu et al. | |
| 8,407,905 B1 | 4/2013 | Hsu et al. | |
| 8,421,082 B1 | 4/2013 | Yang | |
| 8,432,005 B2 | 4/2013 | Yang | |
| 8,432,007 B2 | 4/2013 | Leidl | |
| 8,476,084 B1 | 7/2013 | Yang et al. | |
| 8,476,129 B1 | 7/2013 | Jensen et al. | |
| 8,477,473 B1 | 7/2013 | Koury et al. | |
| 8,486,723 B1 | 7/2013 | Wan | |
| 8,516,886 B2 | 8/2013 | Acar et al. | |
| 8,553,389 B1 | 10/2013 | Koury et al. | |
| 8,584,521 B1 | 11/2013 | Yang | |
| 8,592,993 B2 | 11/2013 | Yang | |
| 8,637,943 B1 | 1/2014 | Yang | |
| 8,643,612 B2 | 2/2014 | Yang | |
| 8,652,961 B1 | 2/2014 | Yang | |
| 8,723,986 B1 | 5/2014 | Merrill | |
| 8,742,520 B2 | 6/2014 | Wan et al. | |
| 8,749,004 B2 | 6/2014 | Yang | |
| 8,794,065 B1 | 8/2014 | Yang | |
| 8,797,279 B2 | 8/2014 | Yang | |
| 8,869,616 B1 | 10/2014 | Sridharamurthy et al. | |
| 8,878,312 B2 | 11/2014 | Hung et al. | |
| 8,928,602 B1 | 1/2015 | Wan | |
| 8,928,696 B1 | 1/2015 | Yang | |
| 8,936,959 B1 | 1/2015 | Yang | |
| 8,969,101 B1 | 3/2015 | Wan | |
| 8,981,560 B2 | 3/2015 | Jensen et al. | |
| 8,993,362 B1 | 3/2015 | Flannery | |
| 9,013,011 B1 * | 4/2015 | Kuo | H01L 27/04 257/415 |
| 9,150,406 B2 | 10/2015 | Yang | |
| 9,276,080 B2 | 3/2016 | Sridharamurthy et al. | |
| 9,346,668 B1 * | 5/2016 | Dreiza | H01L 27/04 |
| 2003/0196490 A1 | 10/2003 | Cardarelli | |
| 2004/0227201 A1 | 11/2004 | Borwick et al. | |
| 2005/0252293 A1 | 11/2005 | Won et al. | |
| 2006/0049826 A1 | 3/2006 | Daneman et al. | |
| 2007/0141739 A1 * | 6/2007 | Thompson | C08J 3/243 438/28 |
| 2007/0181962 A1 | 8/2007 | Partridge et al. | |
| 2007/0281379 A1 | 12/2007 | Stark et al. | |
| 2008/0014682 A1 | 1/2008 | Yang et al. | |
| 2008/0048309 A1 * | 2/2008 | Corisis | H01L 23/13 257/686 |
| 2008/0060193 A1 * | 3/2008 | Farnworth | H01L 21/486 29/847 |
| 2008/0254557 A1 * | 10/2008 | Kim | G02B 27/0955 438/27 |
| 2008/0314147 A1 * | 12/2008 | Nasiri | G01P 15/125 73/514.32 |
| 2009/0309203 A1 | 12/2009 | Seppala et al. | |
| 2010/0071467 A1 | 3/2010 | Nasiri et al. | |
| 2010/0083756 A1 | 4/2010 | Merz et al. | |
| 2010/0236327 A1 | 9/2010 | Mao | |
| 2011/0030473 A1 | 2/2011 | Acar | |
| 2011/0031565 A1 | 2/2011 | Marx | |
| 2011/0121416 A1 | 5/2011 | Quevy et al. | |
| 2011/0154905 A1 | 6/2011 | Hsu et al. | |
| 2012/0012970 A1 | 1/2012 | Xu et al. | |
| 2012/0223726 A1 | 9/2012 | Zhang et al. | |
| 2012/0248506 A1 | 10/2012 | Yang | |
| 2012/0248615 A1 | 10/2012 | Chien et al. | |
| 2013/0042686 A1 | 2/2013 | Lin et al. | |
| 2013/0082338 A1 | 4/2013 | Pan et al. | |
| 2013/0247662 A1 | 9/2013 | Jin et al. | |
| 2013/0247666 A1 | 9/2013 | Acar | |
| 2013/0328139 A1 | 12/2013 | Acar | |
| 2014/0062567 A1 * | 3/2014 | Waters | G01P 15/097 327/306 |
| 2014/0239423 A1 * | 8/2014 | Liu | B81C 1/00793 257/417 |
| 2014/0298910 A1 * | 10/2014 | Simoni | G01P 15/125 73/514.32 |
| 2014/0374856 A1 * | 12/2014 | Chen | B81B 3/0005 257/418 |
| 2015/0137806 A1 | 5/2015 | Wan et al. | |
| 2015/0166330 A1 | 6/2015 | Lee | |

OTHER PUBLICATIONS

Non-Final Office Action received in U.S. Appl. No. 14/507,177, dated May 12, 2016. 12 pages.

Notice of Allowance received in U.S. Appl. No. 14/507,177, dated Sep. 9, 2016. 5 pages.

* cited by examiner

METHOD OF FABRICATING MEMS DEVICES USING PLASMA ETCHING AND DEVICE THEREFOR

CROSS-REFERENCES TO RELATED APPLICATIONS

The present application claims priority to and incorporates by reference, for all purposes, commonly-owned U.S. Provisional App. 61/953,699, filed on Mar. 14, 2014. The present application also incorporates by reference, for all purposes, the following commonly-owned pending patent applications: U.S. patent application Ser. No. 14/507,177, filed Oct. 4, 2014, and U.S. patent application Ser. No. 13/788,503, filed Mar. 7, 2013.

BACKGROUND OF THE INVENTION

The present invention is directed to MEMS (Micro-Electro-Mechanical-Systems). More specifically, embodiments of the invention provide methods and structures for improving integrated MEMS devices, including MEMS sensors and the like.

Research and development in integrated microelectronics have continued to produce astounding progress in CMOS and MEMS. CMOS technology has become the predominant fabrication technology for integrated circuits (IC). MEMS, however, continues to rely upon conventional process technologies. In layman's terms, microelectronic ICs are the "brains" of an integrated device which provides decision-making capabilities, whereas MEMS are the "eyes" and "arms" that provide the ability to sense and control the environment. Some examples of the widespread application of these technologies are the switches in radio frequency (RF) antenna systems, such as those in the iPhone™ device by Apple, Inc. of Cupertino, Calif., and the Blackberry™ phone by Research In Motion Limited of Waterloo, Ontario, Canada, and accelerometers in sensor-equipped game devices, such as those in the Wii™ controller manufactured by Nintendo Company Limited of Japan. Though they are not always easily identifiable, these technologies are becoming ever more prevalent in society every day.

Beyond consumer electronics, use of IC and MEMS has limitless applications through modular measurement devices such as accelerometers, gyroscopes, actuators, and sensors. In conventional vehicles, accelerometers and gyroscopes are used to deploy airbags and trigger dynamic stability control functions, respectively. MEMS gyroscopes can also be used for image stabilization systems in video and still cameras, and automatic steering systems in airplanes and torpedoes. Biological MEMS (Bio-MEMS) implement biosensors and chemical sensors for Lab-On-Chip applications, which integrate one or more laboratory functions on a single millimeter-sized chip only. Other applications include Internet and telephone networks, security and financial applications, and health care and medical systems. As described previously, ICs and MEMS can be used to practically engage in various type of environmental interaction.

Although highly successful, ICs and in particular MEMS still have limitations. Similar to IC development, MEMS development, which focuses on increasing performance, reducing size, and decreasing cost, continues to be challenging. Additionally, applications of MEMS often require increasingly complex microsystems that desire greater computational power. Unfortunately, such applications generally do not exist. These and other limitations of conventional MEMS and ICs are further described throughout the present specification and more particularly below.

From the above, it is seen that techniques for improving operation of integrated circuit devices and MEMS are highly desired.

BRIEF SUMMARY OF THE INVENTION

The present invention is directed to MEMS (Micro-Electro-Mechanical-Systems). More specifically, embodiments of the invention provide methods for fabricating an integrated MEMS device, including MEMS sensors and the like, and a resulting device structure. Merely by way of example, the MEMS device can include at least an accelerometer, a gyroscope, a magnetic sensor, a pressure sensor, a microphone, a humidity sensor, a temperature sensor, a chemical sensor, a biosensor, an inertial sensor, and others. But it will be recognized that the invention has a much greater range of applicability.

In an embodiment, the present invention provides a method for fabricating an MEMS sensor device. The method can include the following steps: providing a substrate, forming an IC layer overlying the substrate, forming an oxide layer overlying the IC layer, forming a meta layer coupled to the IC layer through the oxide layer, coupling a MEMS layer having a pair of designated sense electrode portions and a designated proof mass portion overlying the oxide layer, forming a via structure within each of the designated sense electrode portions, and etching the MEMS layer to form a pair of sense electrodes and a proof mass from the designated sense electrode portions and proof mass portions, respectively. The via structure can include a ground post and the proof mass can include a sense comb. The MEMS sensor device formed using this method can result is more well-defined edges of the proof mass structure.

Embodiments of the present invention provide a means to improve an etching process used to define a MEMS layer to form MEMS structural components. Such embodiments are believed to also improve the long-term reliability of the MEMS components. In conventional MEMS devices, it was not considered necessary to connect the MEMS conductive moving structures before patterning (i.e. MEMS etching process). By connecting the "conductive material" to a ground post through a via structure, the pattering of these structures results in a good and controlled profile.

Embodiments of the present invention also provide additional means to further improve the reliability of such MEMS structural components. In various embodiments, structures are formed within a capping layer above moving portions of a MEMS layer as well as non-moving portions of the MEMS layer. Such embodiments help reduce deflection of the capping layer, under external pressure, and provide greater performance reliability.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION OF THE INVENTION

The present invention is directed to MEMS (Micro-Electro-Mechanical-Systems). More specifically, embodiments of the invention provide methods for fabricating an integrated MEMS device, including MEMS sensors and the like, and a resulting device structure. Merely by way of example, the MEMS device can include at least an accelerometer, a gyroscope, a magnetic sensor, a pressure sensor, a microphone, a humidity sensor, a temperature sensor, a chemical sensor, a biosensor, an inertial sensor, and others. But it will be recognized that the invention has a much greater range of applicability.

Figure 1A:
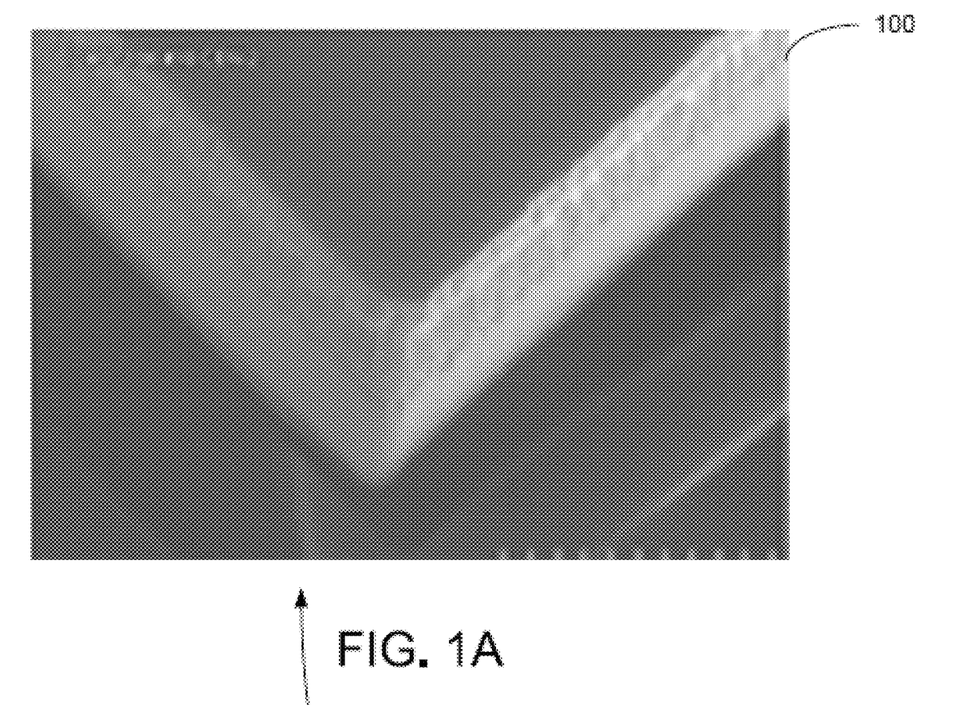
FIG. 1A shows an SEM (Scanning Electron Microscope) image of a proof mass edge according to an embodiment of the present invention.

FIG. 1A shows an SEM (Scanning Electron Microscope) image 100 of a proof mass edge according to an embodiment of the present invention. This image shows an edge portion of a proof mass structure for a MEMS inertial sensor. As shown, the edge shows a serious etching defects when a MEMS via process is not included. According to an embodiment, these kinds of defects can arise from performing a MEMS etching process on a silicon layer that makes all of the MEMS silicon components, including moving and floating fixed parts.

Figure 1B:
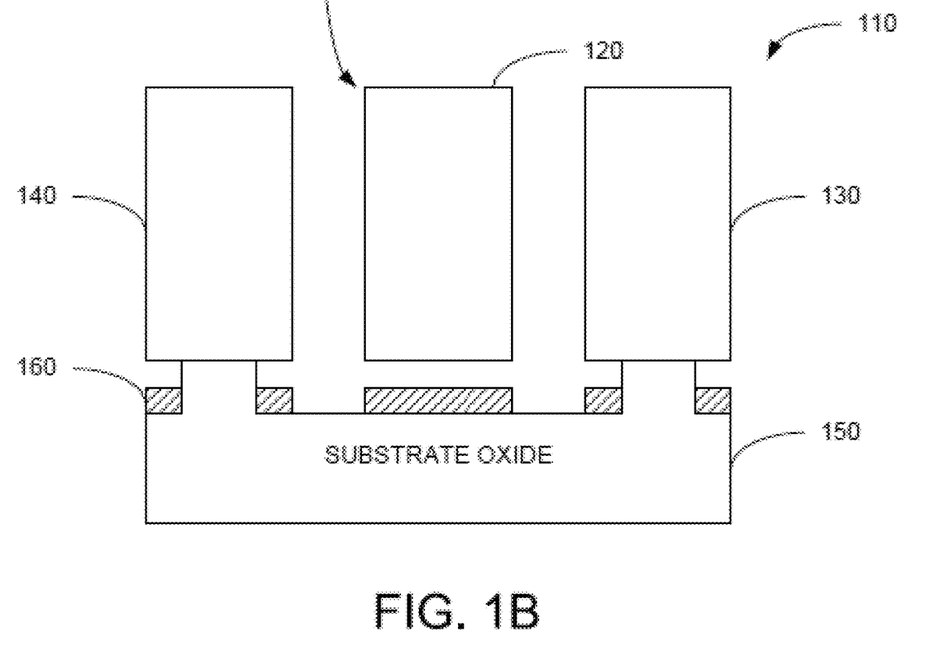
FIG. 1B shows a simplified diagram illustrating a cross-sectional view of a MEMS device according to an embodiment of the present invention.

FIG. 1B shows a simplified diagram illustrating a cross-sectional view 110 of MEMS device according to an embodiment of the present invention. This cross-sectional diagram shows a MEMS sensor structure that corresponds to the image shown in FIG. 1A. As shown, the MEMS sensor can include a sense comb, which can be a portion of or coupled to a proof mass 120, and a pair of sense electrodes 130 and 140 formed overlying an oxide layer 150. This oxide layer can be deposited overlying a processed IC layer and metal routing 160 (shown in figure) can be coupled to the IC layer through the oxide layer 130. Here, the sense electrodes 130 and 140 are fixed components and the sense comb (coupled to proof mass 120) is a moving component. In this example, the sense electrodes 130 and 140 are not configured with embodiments of the present invention.

Figure 2A:
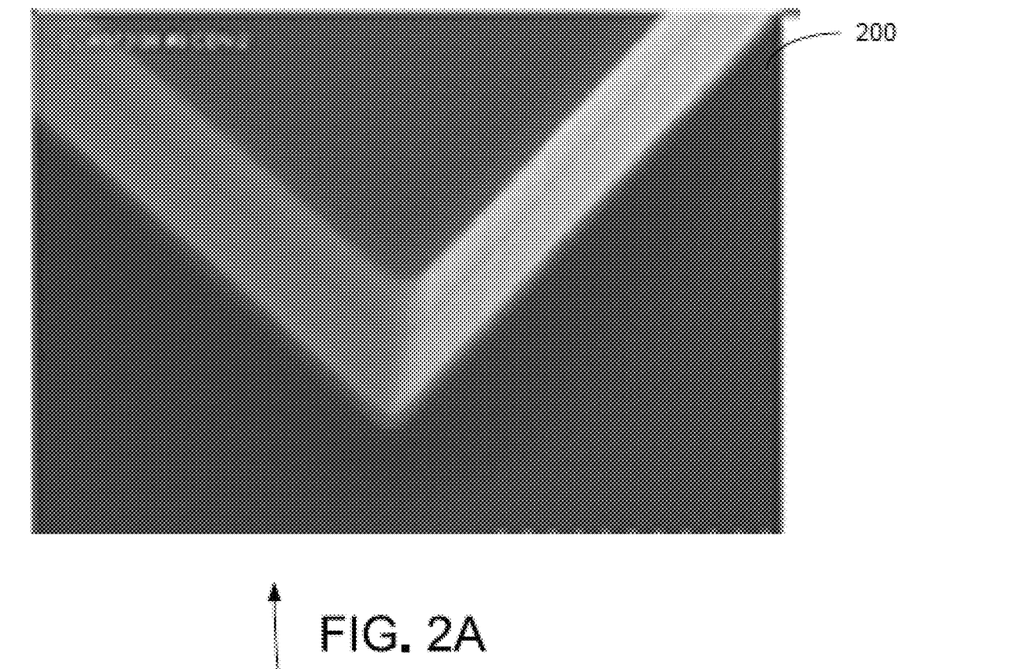
FIG. 2A shows an SEM (Scanning Electron Microscope) image of a proof mass edge according to an embodiment of the present invention.

FIG. 2A shows an SEM (Scanning Electron Microscope) image 200 of a proof mass edge according to an embodiment of the present invention. This image shows another edge portion of a proof mass structure for a MEMS inertial sensor. As shown, the edge shows a well-defined form when a MEMS via process is included in the fabrication steps.

Figure 2B:
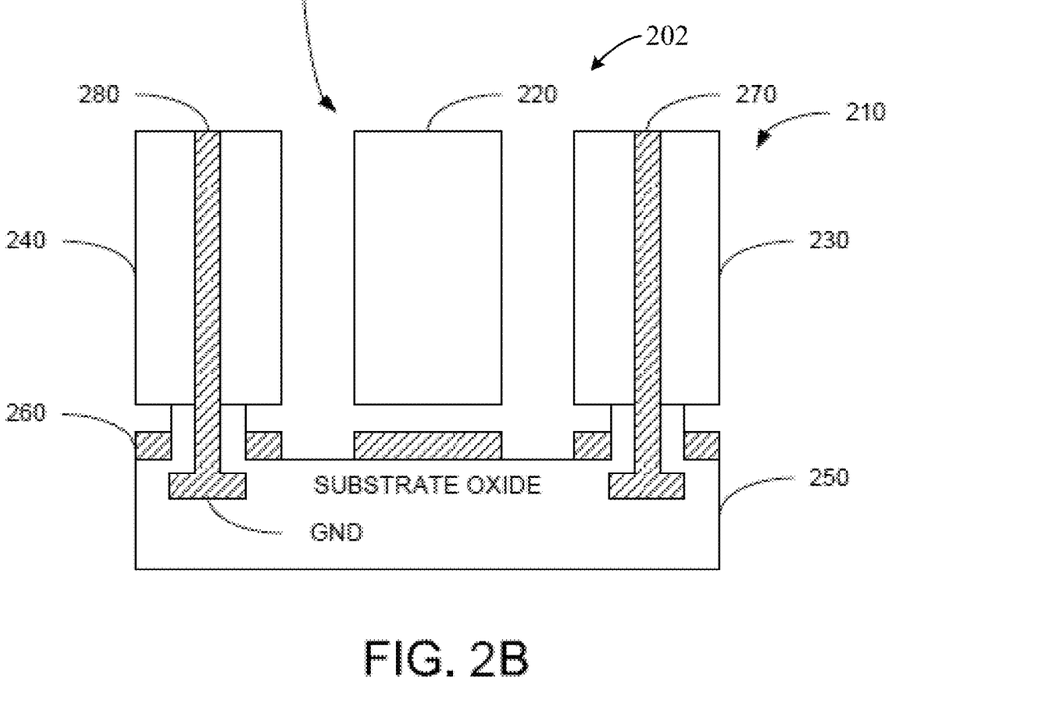
FIG. 2B shows a simplified diagram illustrating a cross-sectional view of MEMS device according to an embodiment of the present invention.

FIG. 2B shows a simplified diagram illustrating a cross-sectional view 210 of MEMS device according to an embodiment of the present invention. This cross-sectional diagram shows a MEMS sensor 202 structure that corresponds to the image shown in FIG. 2A. Similar to the structure of FIG. 1B, the MEMS sensor can include a sense comb, which can be a portion of or coupled to a proof mass 220, and a pair of sense electrodes 230 and 240 formed overlying an oxide layer 250. This oxide layer 250 can also be deposited overlying a processed IC layer 290 and metal routing 260 (partly shown in figure) can be coupled to the IC layer through the oxide layer. In an embodiment, the sense electrodes 230 and 240 are configured with via structures 270 and 280, which run through the length of the sense electrodes 230 and 240 are coupled to another metal portion within the oxide layer. In an embodiment, this via is a ground post to substrate that provides a grounding path to substrate that provides for an improved MEMS etching profile, when the via process is performed prior to the MEMS Si etching process. The ground path can also be provided through a self-test portion.

Figure 3A:
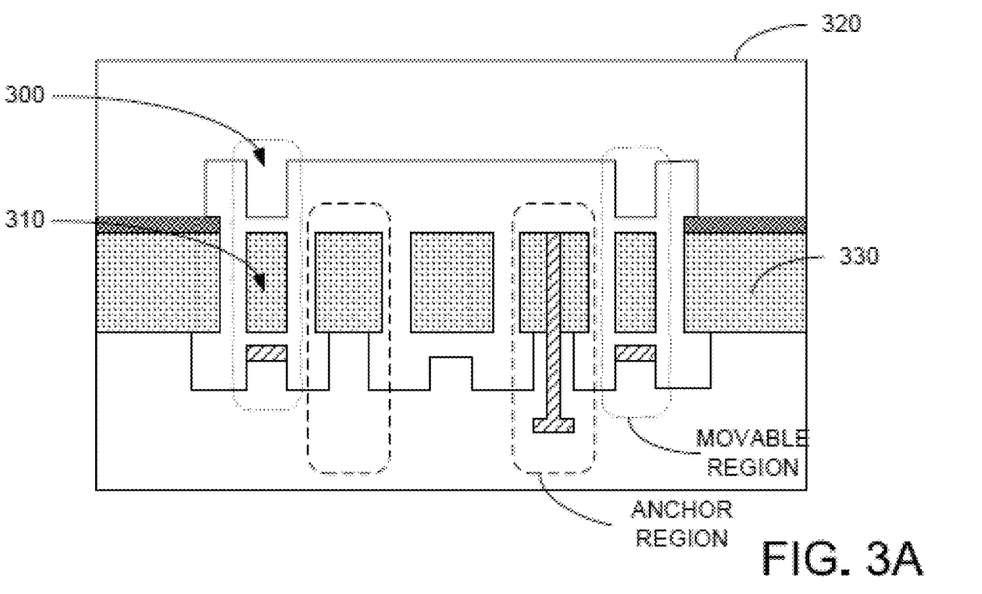
FIGS. 3A-B show simplified diagrams illustrating a cross-sectional views of a MEMS device.

Embodiments of the present invention also provide a means to further improve the reliability of such MEMS structural components. Initially, the inventors considered it desirable to use hard stop limits on the movements of various portions of the MEMS device. As illustrated in FIG. 3A, these were embodied as stoppers 300 in a capping layer 320 above portions 310 of the MEMS layer 330 that move. In various embodiments, the stoppers 300 help prevent portions 310 from moving beyond a safe displacement amount.

Figure 3B:
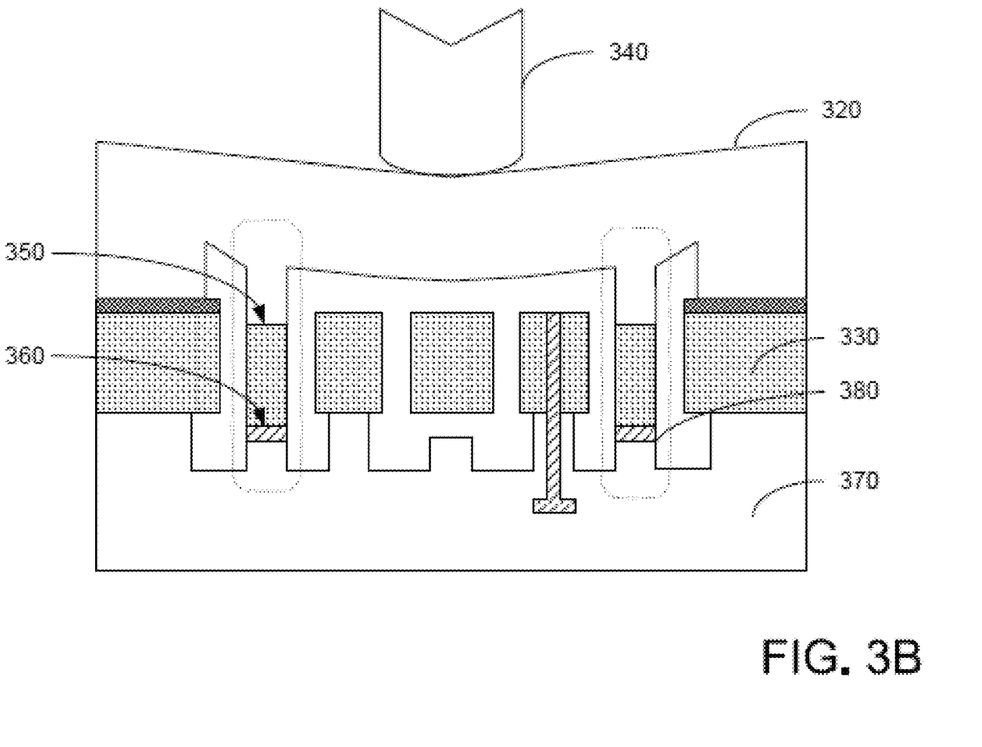

In the embodiment in FIG. 3B, the capping layer 320 is illustrated under an external stress 340. As can be seen, in region 350, capping layer 320 can physically touch MEMS layer 330 and at region 360, MEMS layer 300 can physically touch the semiconductor substrate 370. Such repeated contact is believed to contribute to failure of the MEMS device or the underlying contact layers 380. In some experiments conducted by the inventors, capping layer 320 has been observed to bow-inwards by as much as about 1.8 um for a 300 um center to edge capping layer 320, although for different sizes for capping layer, other displacements are expected.

Figure 4A:
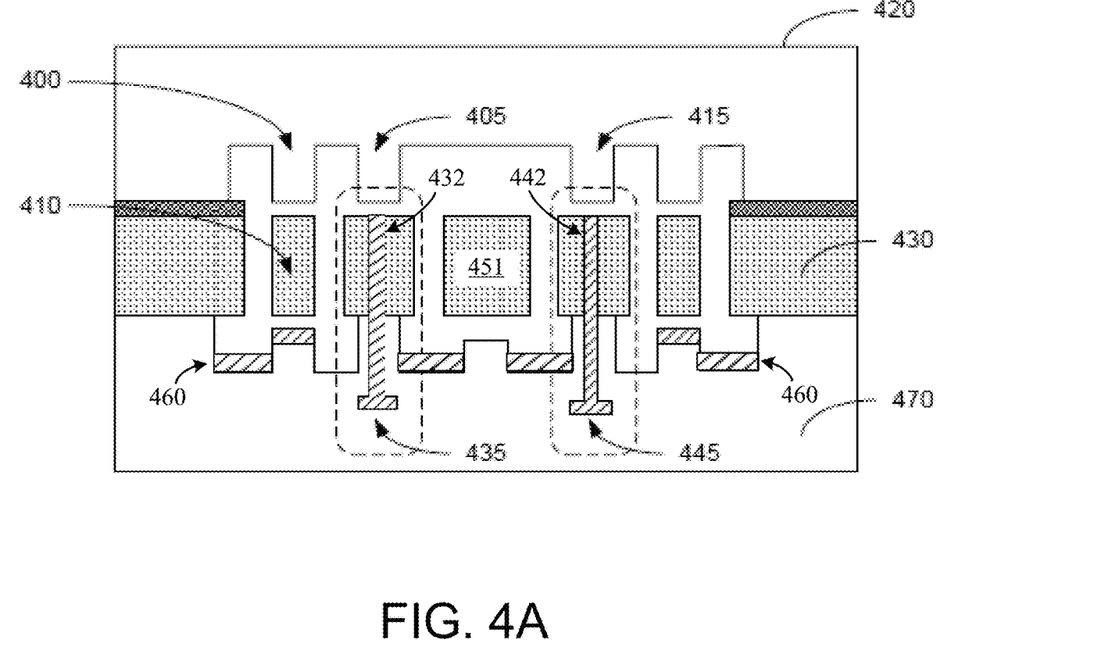
FIGS. 4A-B shows simplified diagrams illustrating a cross-sectional view of a MEMS device according to an embodiment of the present invention.
Figure 4B:
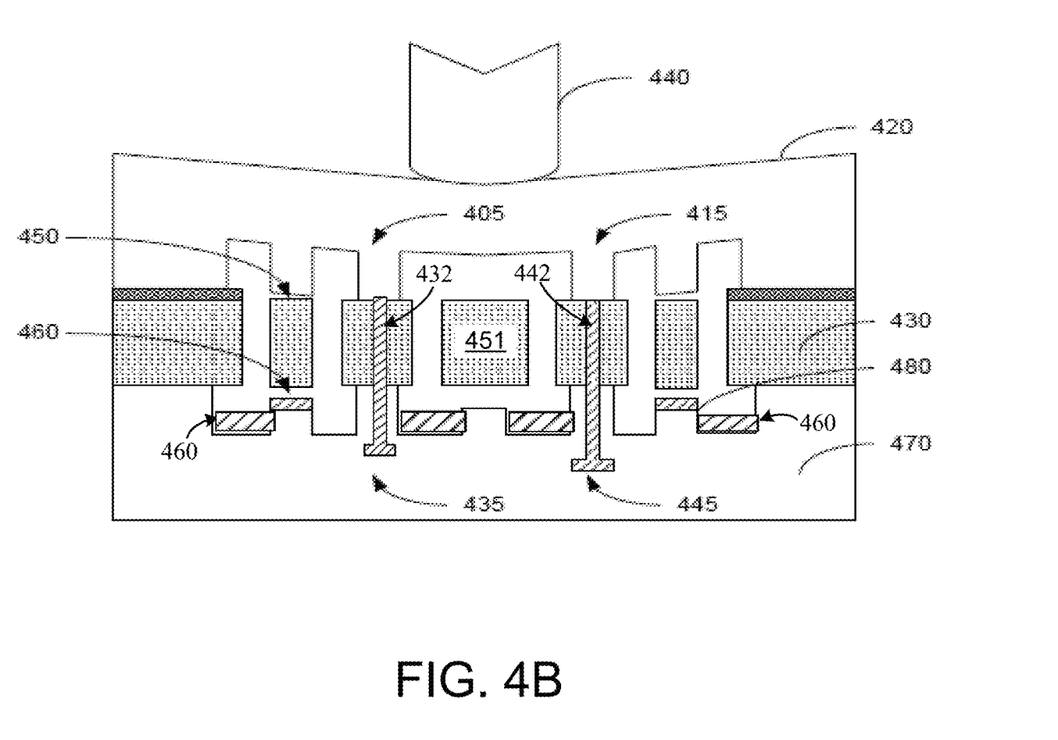

FIGS. 4A-B illustrate various embodiments of the present invention. More specifically, similar to FIG. 2, a MEMS layer 430 has a first portion having a pair of designated sense electrode portions 432 and 442 (also referred to as anchored portions or anchored regions) and a second portion having a proof mass portion 451, wherein the first portion is separated from the second portion. In FIG. 4A, these were stoppers 400 in a capping layer 420 above movable portions 410 of the MEMS layer 430 are illustrated. As described above, stoppers 400 help prevent portions 410 from moving beyond a safe displacement amount. Additionally, stoppers 405 and 415 are also illustrated, above anchor portions 435 and 445 of MEMS layer 430. In some embodiments, anchor point 435 may be an anchor to a sense electrode 432 of MEMS layer 430 on substrate 470, anchor point 445 may be an anchor to a sense electrode 442, as was illustrated above, or the like. Anchor points 435 and 445 are coupled to via structures 432 and 442, which are ground posts that provide a grounding path to substrate.

In the embodiment in FIG. 4B, the capping layer 420 is illustrated under an external stress 440. As can be seen, in region 450, capping layer 420 may slightly touch MEMS layer 430 and at region 460, MEMS layer 400 typically does not touch the semiconductor substrate 470. Instead, as can be seen, stopper 405 contacts anchor portion 435 and stopper 415 contacts anchor portion 445. As anchor portions 435 and 445 are solidly coupled to semiconductor substrate 470, capping layer 420 will deflect to a smaller degree, in response to external stress 440. More significantly, as can be seen in FIG. 4B, the movable portions of MEMS layer 430 are under significantly less stress, as illustrated in FIG. 3B.

In various embodiments, stoppers 400 are similar in height as stopper 405 and 415, as is illustrated in FIG. 4A. In other embodiments, stopper 400 may taller or shorter than stopper 405 and 415, depending upon specific engineering requirements.

As can be seen, the various embodiments described above promote reliability for the MEMS device. Because portions of such MEMS device are flexible, they are prone to manufacturing forces, to internal wear and tear forces and to external forces. Some embodiments may include some, but not necessarily all the features described above in advantageous combination to promote reliability.

Figure 5:
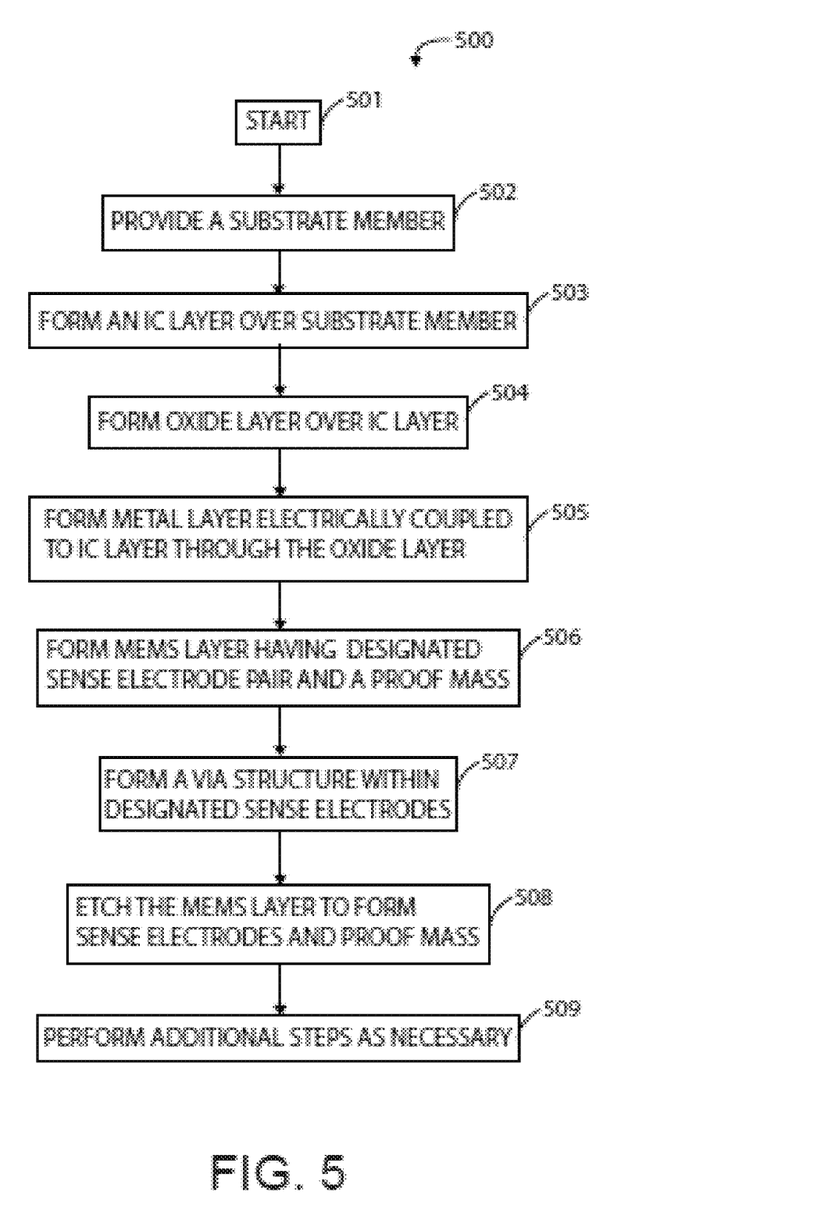
FIG. 5 shows a simplified flow diagram illustrating a method of fabricating a MEMS device according to an embodiment of the present invention.

FIG. 5 is a simplified flow diagram illustrating a method for fabricating a MEMS device according to an embodiment of the present invention. As shown, method 500 can be briefly summarized as follows:

501. Start;
502. Provide a substrate member;
503. Form an IC layer overlying the substrate member;
504. Form an oxide layer overlying the IC layer;
505. Form a metal layer electrically coupled to the IC layer through the oxide layer;
506. Form a MEMS layer having designated sense electrode pair and proof mass;
507. Form a via structure within the designated sense electrodes;
508. Etch the MEMS layer to form sense electrode pair and proof mass; and
509. Perform additional steps as necessary.

In an embodiment, the present invention provides a method for fabricating an MEMS sensor device. The method can include the following steps: providing a substrate, forming an IC layer overlying the substrate, forming an oxide layer overlying the IC layer, forming a metal layer coupled to the IC layer through the oxide layer, forming a MEMS layer having a pair of designated sense electrode portions and a designated proof mass portion overlying the oxide layer, forming a via structure within each of the designated sense electrode portions, and etching the MEMS layer to form a pair of sense electrodes and a proof mass from the designated sense electrode portions and proof mass portions, respectively. The via structure can include a ground post and the proof mass can include a sense comb. The MEMS sensor device formed using this method can result is more well-defined edges of the proof mass structure. Additional steps can be performed as necessary.

In various specific embodiments, the following method steps can be taken. Providing the substrate member can include providing a silicon substrate member. Forming the IC layer can include forming a CMOS-IC layer. Forming the oxide layer can include forming a silicon oxide layer. Forming the metal layer can include forming a CMOS metal layer. Forming the MEMS layer can include forming a silicon MEMs layer. Forming the via structure can include forming the ground post coupled to the via structure. The process for etching the MEMS layer can include a wet etching process, a dry etching process, or the like.

In a specific embodiment, etching the MEMS layer can include forming an inertial sensor, an accelerometer, a gyroscope, a piezo-resistive sensor, or the like. Etching the MEMS layer can include forming the pair of sense electrodes and the proof mass in such a manner that the proof mass is characterized by a well-defined and controlled profile. The pair of sense electrodes can be anchored to an oxide layer of the MEMS device. Those of ordinary skill in the art will recognize other variations, modifications, and alternatives.

In an embodiment, the present invention provides a method for fabricating a MEMS device with improved MEMS sensor structural definition. The method can include the following steps: providing a silicon substrate member, forming an IC (Integrated Circuit) layer overlying the substrate member, forming an oxide layer overlying the IC layer, forming a metal layer coupled to the IC layer through the oxide layer, forming a MEMS layer overlying the oxide layer, forming a forming a grounding path from the MEMS layer to the silicon substrate member, and etching the MEMS layer to form a MEMS sensor.

In a specific embodiment, the forming of the grounding path includes forming a ground post through a portion of the MEMS layer and a portion of the oxide layer. This ground post is coupled to a portion of the metal layer, which is grounded to the silicon substrate. Also, the forming of the ground post can include forming a via structure within a portion of the MEMS layer. This via structure can be coupled to a portion of the metal layer, which is grounded to the silicon substrate.

In a specific embodiment, the forming of the MEMS sensor includes forming a pair of sense electrodes and a proof mass. The grounding path can include a ground post through each of the sense electrodes. Each ground post can be coupled to a portion of the metal layer, which is grounded to the silicon substrate. Also, the etching of the MEMS layer to form a pair of sense electrodes and a proof mass can include electrically separating portions of the MEMS layer. Of course, there can be other variations, modifications, and alternatives.

In an embodiment, the present invention provides a method of fabricating a MEMS device. This method can include providing a silicon substrate member, forming an IC (Integrated Circuit) layer overlying the substrate member, forming an oxide layer overlying the IC layer, forming a metal layer coupled to the IC layer through the oxide layer, and forming a MEMS layer overlying the oxide layer. The MEMS layer can be configured with one or more designated fixed portions and one or more designated moving portions. The method can further include forming a forming a grounding path from the MEMS layer to the silicon substrate member. The grounding path can configured through the one or more designated fixed portions. With the grounding path configured prior to MEMS etching, the MEMS layer can then be patterned to form a MEMS sensor. The MEMS sensor includes one or more fixed portions formed from the one or more designated fixed portions and one or more moving portions formed from the one or more designated moving portions.

In a specific embodiment, the forming of the grounding path includes forming a ground post through the one or more designated fixed portions and a portion of the oxide layer. The ground post is coupled to a portion of the metal layer, which is grounded to the silicon substrate. Forming the ground post can include forming a via structure within the one or more designated fixed portions. The via structure can be coupled to a portion of the metal layer, which is grounded to the silicon substrate. The via structure can extend into the oxide layer and can be configured to reach a metallic layer. A metal material can be disposed within the via structure in contact with the metallic layer to form the ground post.

In a specific embodiment, the method of fabricating the MEMS device can include forming a cap layer having a plurality of stops. Also, the cap layer can be disposed on top of the MEMS layer to thereby encapsulate the MEMS layer. At least one of the plurality of stops in the cap layer can be initially disposed above, but not in contact with, at least a sense electrode from the pair of sense electrodes. At least one of the plurality of stops in the cap layer can be initially disposed above, but not in vontact with, the proof mass.

Embodiments of the present invention provide a means to improve an etching process used to define a MEMS layer to form MEMS structural components. In conventional embodiments, it was not considered necessary to connect the MEMS conductive moving structures before patterning (i.e. MEMS etching process). By connecting the "conductive material" to a ground post through a via structure, the patterning of these structures results in a good and controlled profile.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:
1. A MEMS device, the device comprising:
   a substrate member;
   an IC (Integrated Circuit) layer overlying the substrate member;
   an oxide layer overlying the IC layer comprising a pair of anchor portions;
   a metal layer coupled to the IC layer through the oxide layer;
   a silicon MEMS layer disposed above the oxide layer, wherein the silicon MEMS layer comprises a first portion and a second portion separated by a void in the silicon MEMS layer, wherein the first portion comprises a pair of designated stationary sense electrode portions, wherein each designated stationary sense electrode portion is respectively disposed above and upon one anchor portion of the pair of anchor portions, wherein the second portion comprises a movable proof mass portion, wherein a top-most surface of the first portion is in a same plane as a top-most surface of the second portion, and wherein a bottom-most surface of the first portion is in a same plane as a bottom-most surface of the second portion;
   wherein a ground post is formed in a via structure formed within at least one designated stationary sense electrode portion of the pair of designated stationary sense electrode portions; and
   a cap layer disposed on top of the silicon MEMS layer to thereby overlie at least the second portion of the MEMS layer, wherein the cap layer comprises a first plurality of stops that are disposed above and vertically aligned to the pair of designated stationary sense electrode portions and the pair of anchor portions.
2. The device of claim 1 wherein the MEMS device comprises a device selected from a group consisting of: an accelerometer and a gyroscope.
3. The device of claim 1 wherein the pair of designated stationary sense electrode portions are anchored to the oxide layer.
4. The device of claim 1 wherein a first stop from the first plurality of stops in the cap layer is initially disposed above, but not in contact with, at least a designated stationary sense electrode portion from the pair of designated sense electrode portions.

5. The device of claim 4 wherein a second stop from the first plurality of stops in the cap layer is initially disposed above, but not in contact with, the movable proof mass portion.
6. The device of claim 5 wherein a height of the first stop and a height of the second stop are substantially similar.
7. The device of claim 1 wherein the via structure extends into the oxide layer and reaches a metallic layer.
8. The device of claim 1 wherein the pair of designated stationary sense electrode portions are disposed on either side of the movable proof mass portion.
9. The device of claim 1
   wherein the movable proof mass portion comprises a pair of proof masses; and
   wherein the cap layer comprises a second plurality of stops that are disposed above, but not in contact with the pair of proof masses.
10. The device of claim 1
    wherein the movable proof mass portion comprises a pair of proof masses; and
    wherein the oxide layer comprises a pair of stops that are disposed below, but not in contact with the pair of proof masses.
11. A MEMS device, the device comprising:
    a substrate member;
    an IC (Integrated Circuit) layer overlying the substrate member;
    an oxide layer overlying the IC layer comprising a pair of anchor portions;
    a metal layer coupled to the IC layer through the oxide layer;
    a silicon MEMS layer overlying the oxide layer, wherein the silicon MEMS layer comprises a first portion having a pair of designated portions anchored to at least the pair of anchor portions of the oxide layer and a second portion having a proof mass portion configured to move relative to the oxide layer, wherein the first portion and the second portion are formed from etching a silicon material layer, wherein a top-most surface of the first portion is in a same plane as a top-most surface of the second portion, and wherein a bottom-most surface of the first portion is in a same plane as a bottom-most surface of the second portion, wherein the first portion is laterally separated from the second portion;
    wherein a ground post is formed in a via structure formed within at least one designated portion of the pair of designated portions anchored to an ancor portion of the pair of anchor portions of the oxide layer; and
    a cap layer overlying the silicon MEMS layer, wherein the cap layer comprises a first plurality of stops that are disposed above and vertically aligned the pair of designated portions and to the pair of anchor portions of the oxide layer.
12. The device of claim 11 wherein the MEMS device comprises a device selected from a group consisting of: an accelerometer and a gyroscope.
13. The device of claim 11 wherein the pair of designated portions are anchored to the oxide layer.
14. The device of claim 11 wherein a first stop from the first plurality of stops in the cap layer is initially disposed above, but not in contact with, at least a designated portion from the pair of designated portions.
15. The device of claim 14 wherein a second stop from the first plurality of stops in the cap layer is initially disposed above, but not in contact with, the movable proof mass portion.

16. The device of claim 15 wherein a height of the first stop and a height of the second stop are substantially similar.

17. The device of claim 11 wherein the via structure extends into the oxide layer and reaches a metallic layer.

18. The device of claim 11 wherein the pair of designated portions are disposed on either side of the second portion.

19. The device of claim 11
wherein the proof mass portion comprises a pair of proof masses; and
wherein the cap layer comprises a second plurality of stops that are disposed above the pair of proof masses.

20. The device of claim 11
wherein the proof mass portion comprises a pair of proof masses; and
wherein the oxide layer comprises a pair of stops that are disposed below, but not in contact with the pair of proof masses.

* * * * *